(12) United States Patent  
Anderson et al.

(10) Patent No.: US 7,646,070 B2
(45) Date of Patent: Jan. 12, 2010

(54) SPACERS FOR FINFETS (FIELD EFFECT TRANSISTORS)

(75) Inventors: Brent Alan Anderson, Jericho, VT (US); Edward Joseph Nowak, Essex Junction, VT (US); Kathryn Turner Schoenenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/124,410

(22) Filed: May 21, 2008

(65) Prior Publication Data

US 2008/0217694 A1 Sep. 11, 2008

Related U.S. Application Data

(62) Division of application No. 11/679,862, filed on Feb. 28, 2007, now Pat. No. 7,399,664.

(51) Int. Cl.
*H01L 27/088* (2006.01)
(52) U.S. Cl. .............................. 257/401; 257/E21.409
(58) Field of Classification Search ................ 257/288, 257/215, 255, 347, E29.133, 401, 331, 350, 257/E21.409
See application file for complete search history.

(56) References Cited

U.S. PATENT DOCUMENTS

| | | | |
|---|---|---|---|
| 6,030,898 A | 2/2000 | Liu | |
| 6,838,322 B2 | 1/2005 | Pham et al. | |
| 6,853,020 B1 | 2/2005 | Yu et al. | |
| 6,927,104 B2 | 8/2005 | Lee et al. | |
| 6,951,784 B1 | 10/2005 | Anderson et al. | |
| 6,992,354 B2 | 1/2006 | Nowak et al. | |
| 7,105,390 B2 | 9/2006 | Brask et al. | |
| 7,271,456 B2* | 9/2007 | Oh et al. ............. | 257/401 |
| 7,288,805 B2 | 10/2007 | Anderson et al. | |
| 7,326,608 B2 | 2/2008 | Lee et al. | |
| 7,348,254 B2 | 3/2008 | Park | |
| 2004/0217420 A1* | 11/2004 | Yeo et al. ............. | 257/347 |
| 2006/0014338 A1 | 1/2006 | Doris et al. | |
| 2006/0022268 A1* | 2/2006 | Oh et al. ............. | 257/347 |
| 2006/0154426 A1 | 7/2006 | Anderson et al. | |
| 2006/0197147 A1 | 9/2006 | Anderson et al. | |
| 2009/0072276 A1* | 3/2009 | Inaba ................... | 257/255 |

\* cited by examiner

*Primary Examiner*—Nathan W Ha
(74) *Attorney, Agent, or Firm*—Schmeiser, Olsen & Watts; Richard M. Kotulak

(57) ABSTRACT

A spacer structure for FinFETs. The structure includes (a) a substrate, (b) a semiconductor fin region on top of the substrate, (c) a gate dielectric region on side walls of the semiconductor fin region, and (d) a gate electrode region on top and on side walls of the semiconductor fin region. The gate dielectric region (i) is sandwiched between and (ii) electrically insulates the gate electrode region and the semiconductor fin region. The structure further includes a first spacer region on a first side wall of the gate electrode region. A first side wall of the semiconductor fin region is exposed to a surrounding ambient. A top surface of the first spacer region is coplanar with a top surface of the gate electrode region.

11 Claims, 12 Drawing Sheets

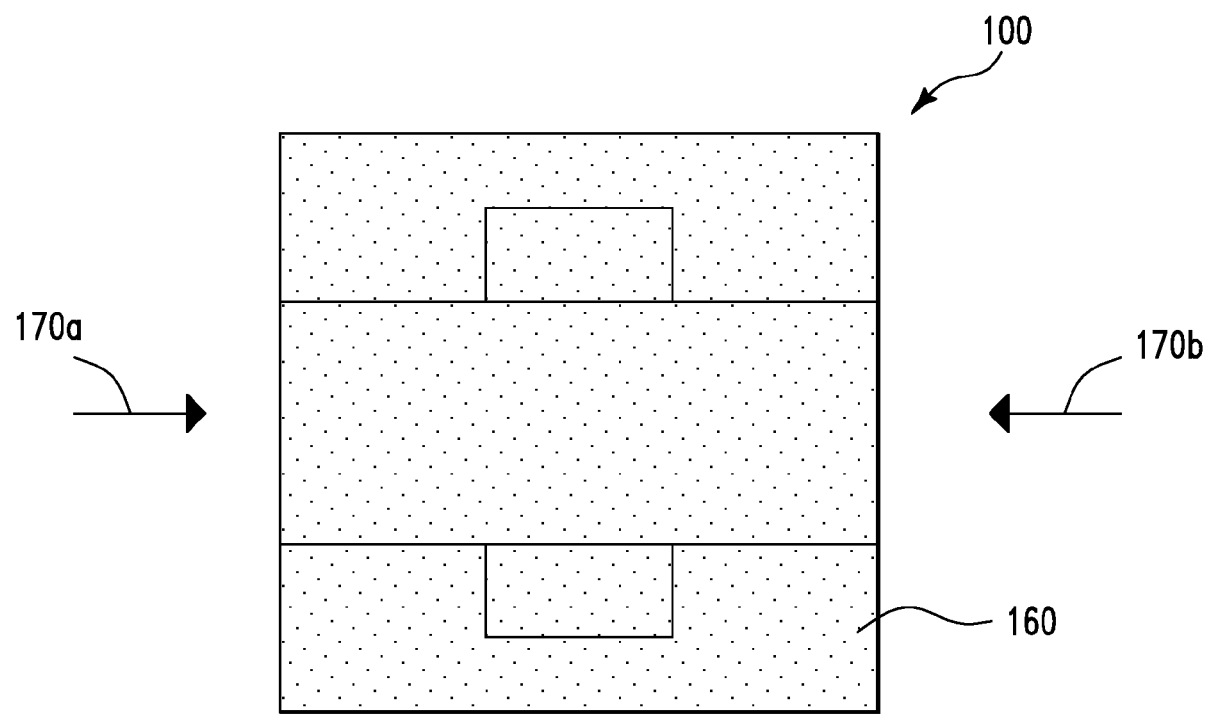
FIG.1Ei
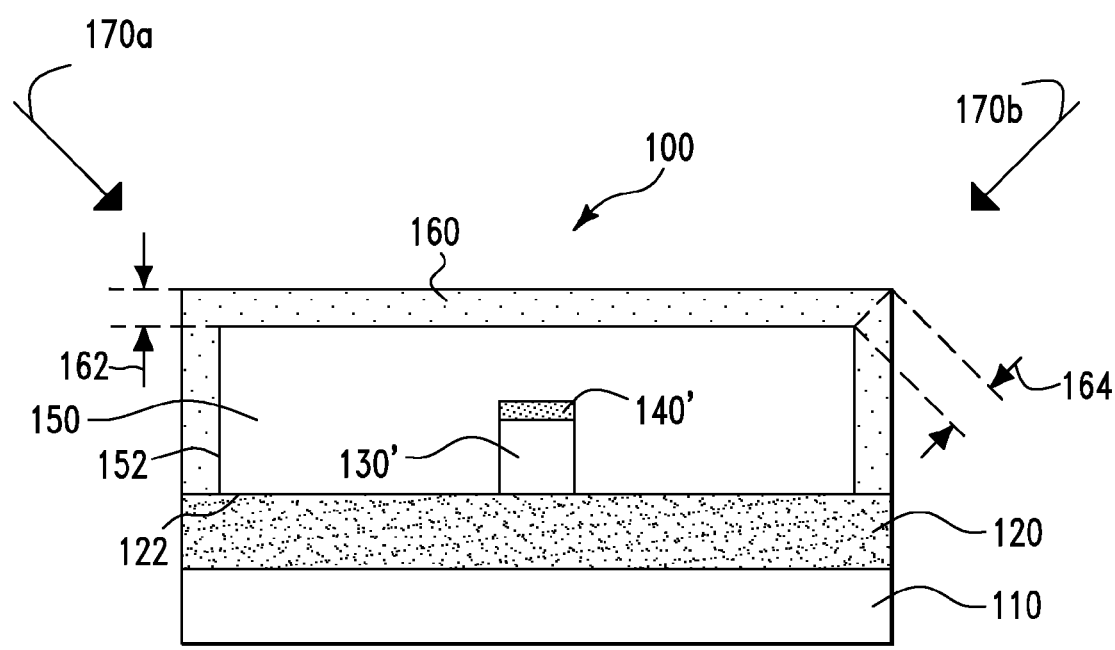
FIG.1Eii

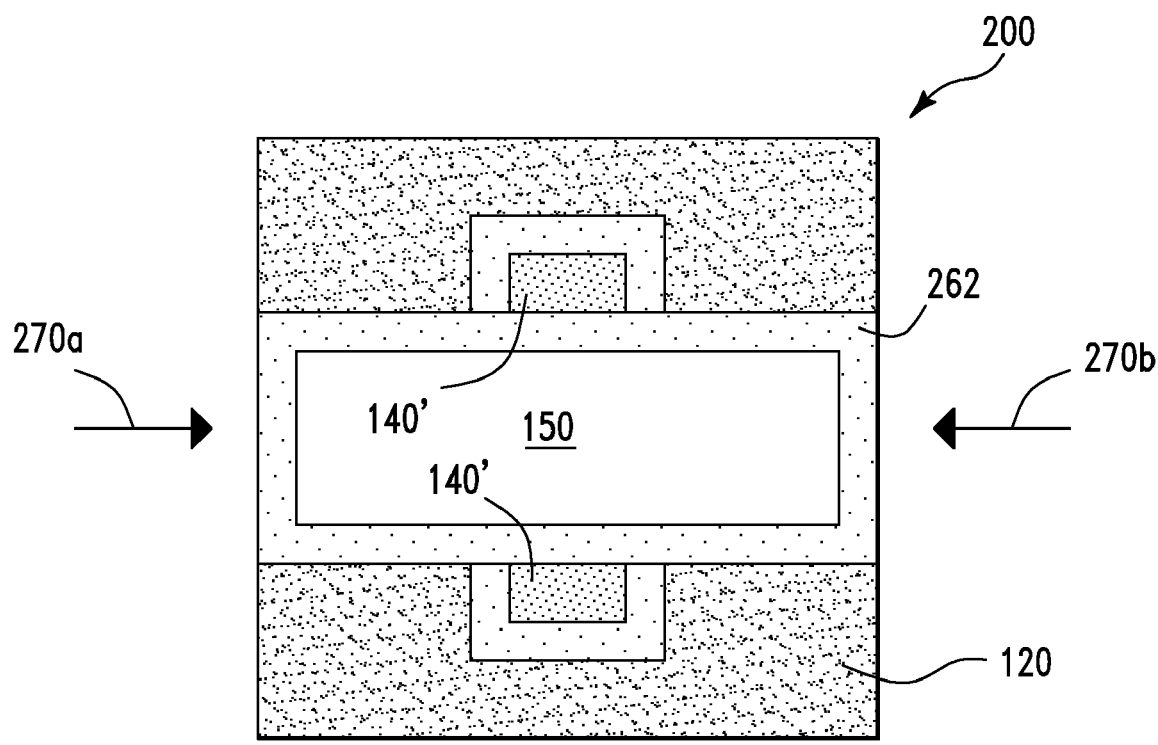
FIG.2Bi
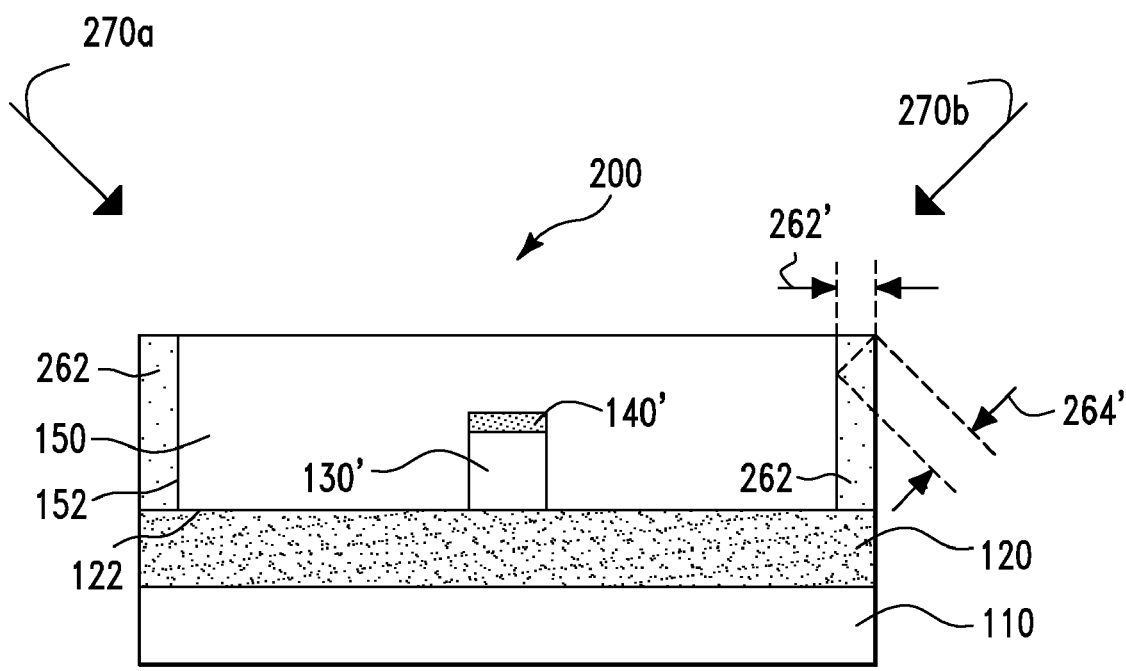
FIG.2Bii

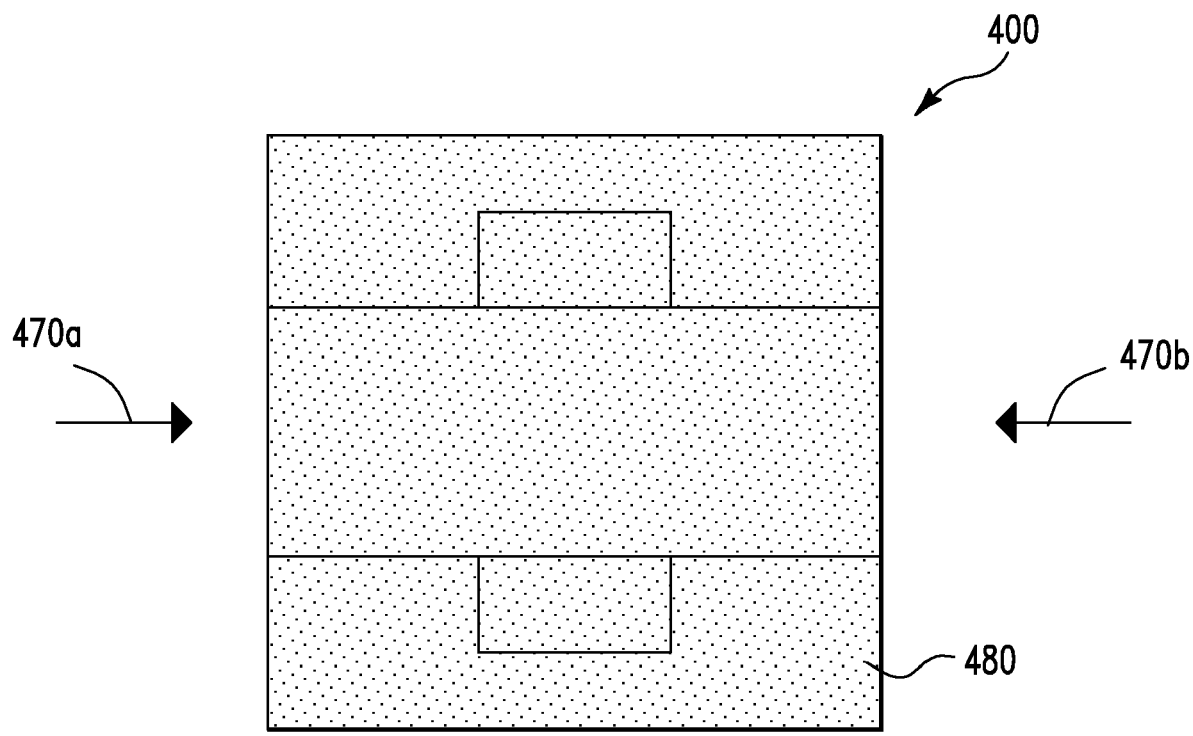
FIG.3Ci
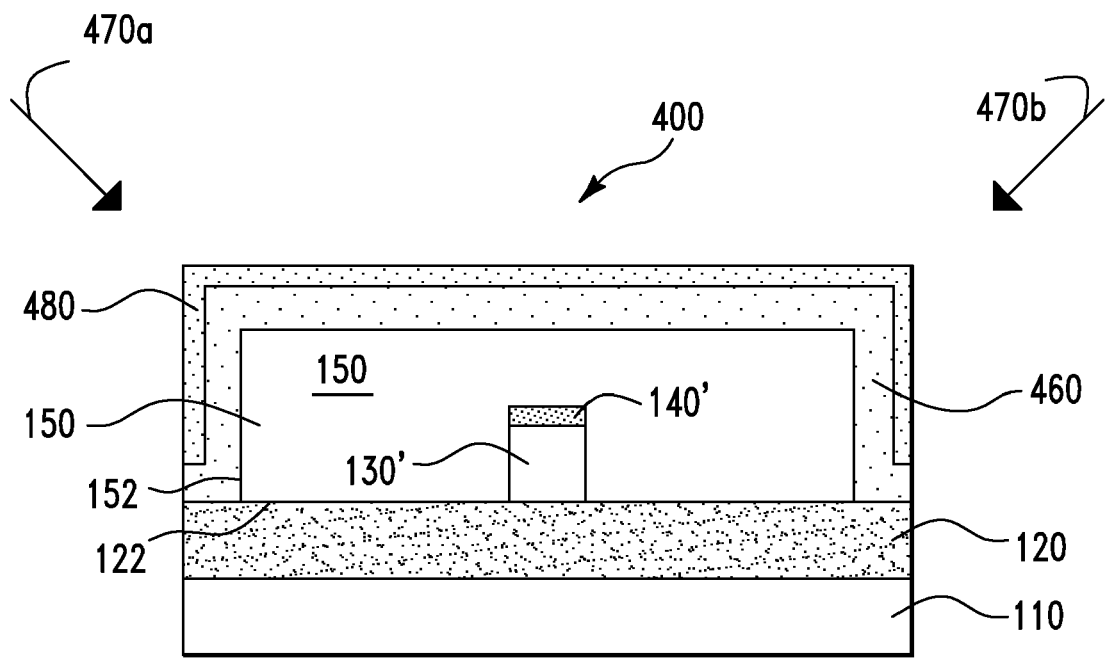
FIG.3Cii

SPACERS FOR FINFETS (FIELD EFFECT TRANSISTORS)

This application is a divisional application claiming priority to Ser. No. 11/679,862, filed Feb. 28, 2007.

FIELD OF THE INVENTION

The present invention relates generally to spacers for FETs (Field Effect Transistors) and more particularly to the formation of spacers for FinFETs.

BACKGROUND OF THE INVENTION

In a conventional fabrication process of a FinFET (Fin Field Effect Transistor), it is desirable to form spacers on side walls of the gate electrode region of the FinFET while keeping the side walls of the fin region exposed to the surrounding ambient. Therefore, there is a need for a method for forming spacers on side walls of the gate electrode region while keeping the side walls of the fin region exposed to the surrounding ambient.

SUMMARY OF THE INVENTION

The present invention provides a structure fabrication method, comprising providing a structure which includes (a) a substrate, (b) a device block on top of the substrate, and (c) a conformal spacer layer on top of both the substrate and the device block, wherein the device block comprises a first side wall and a second side wall, and wherein the first side wall is not parallel to the second side wall; bombarding the conformal spacer layer with particles in directions parallel to the first side wall but not parallel to the second side wall resulting in (i) damaged regions of the conformal spacer layer on the second side wall and (ii) undamaged regions of the conformal spacer layer on the first side wall; and then removing the damaged regions of the conformal spacer layer from the second side wall without removing the undamaged regions of the conformal spacer layer from the first side wall.

The present invention provides a method for forming spacers on side walls of the gate electrode region while keeping the side walls of the fin region exposed to the surrounding ambient.

DETAILED DESCRIPTION OF THE INVENTION

FIGS. 1A-1F show a fabrication process for forming a first semiconductor structure 100, in accordance with embodiments of the present invention. More specifically, with reference to FIG. 1A, the fabrication process for forming the first semiconductor structure 100 starts with an SOI (Silicon-On-Insulator) substrate 110+120+130. The SOI substrate 110+120+130 comprises a silicon layer 110, a silicon dioxide layer 120 on top of the silicon layer 110, and a silicon layer 130 on top of the silicon dioxide layer 120.

Figure 1A:
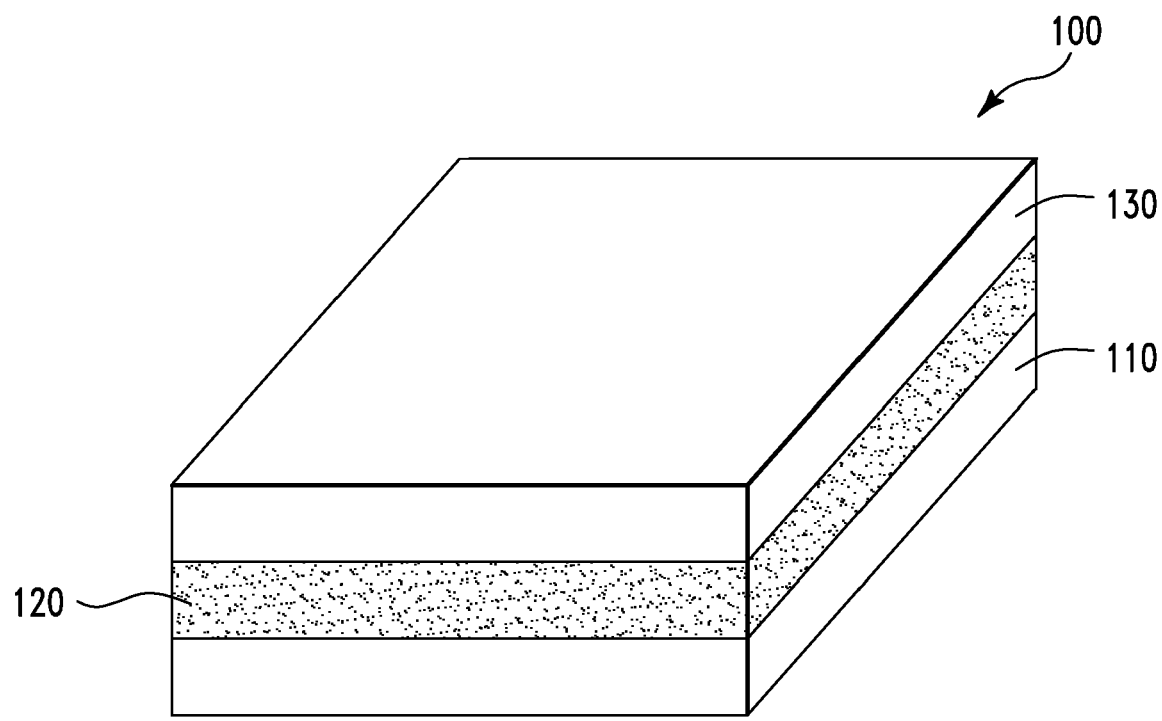
FIGS. 1A-1F show a fabrication process for forming a first semiconductor structure, in accordance with embodiments of the present invention.
Figure 1B:
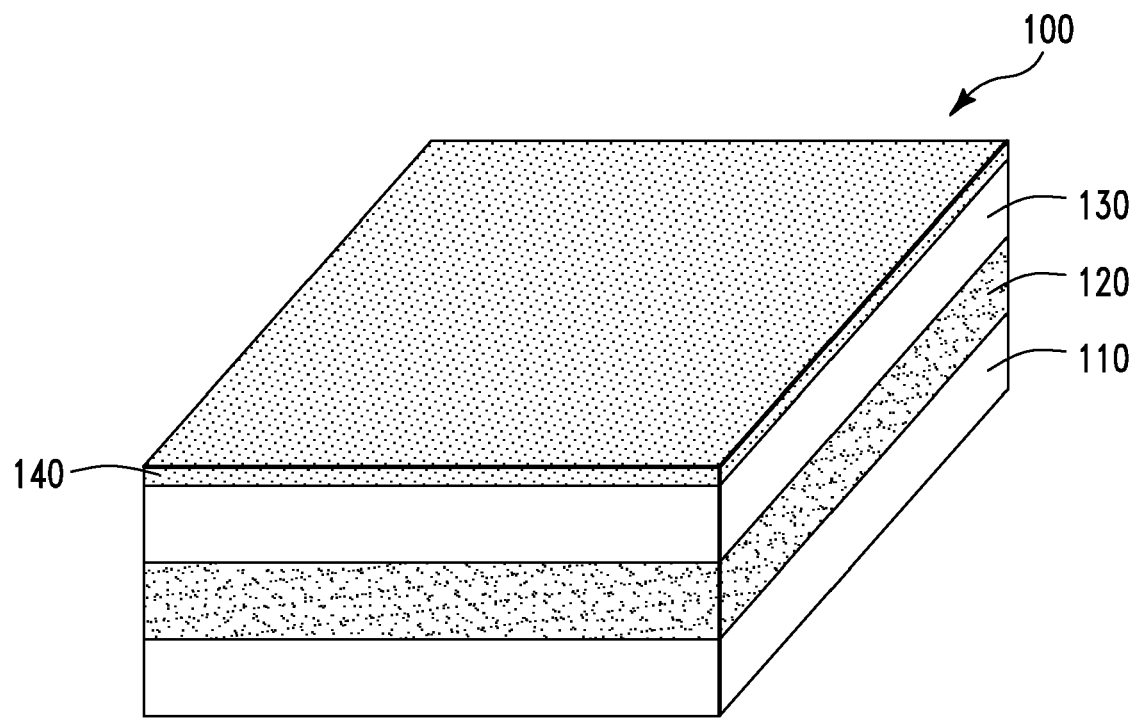

Next, with reference to FIG. 1B, in one embodiment, a hard mask layer 140 is formed on top of the SOI substrate 110+120+130. More specifically, the hard mask layer 140 can comprise silicon nitride. The hard mask layer 140 can be formed by CVD (Chemical Vapor Deposition) of silicon nitride on top of the SOI substrate 110+120+130.

Figure 1C:
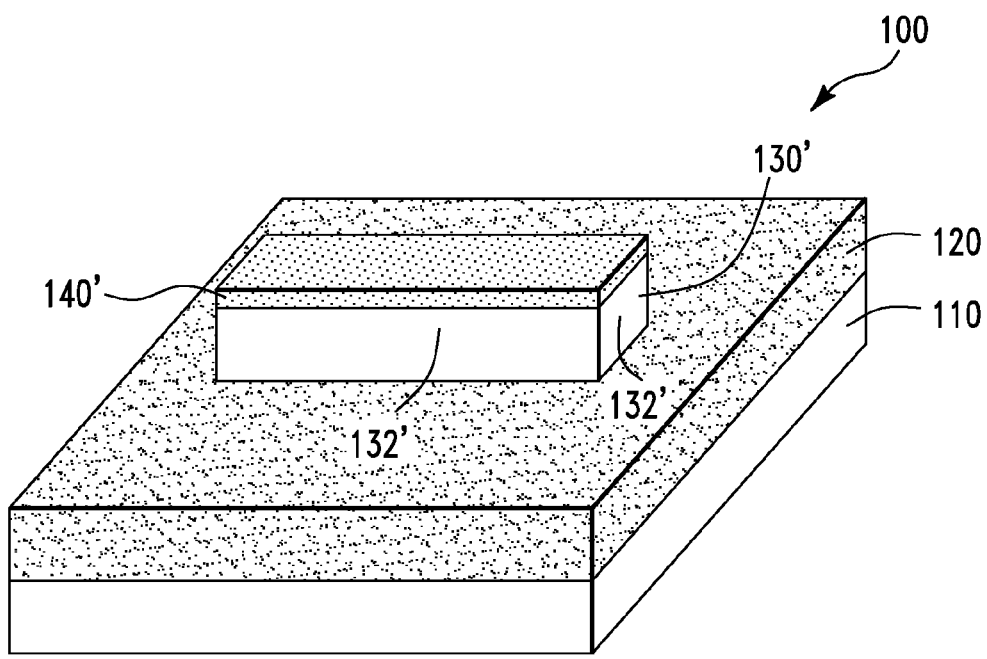

Next, in one embodiment, the hard mask layer 140 and the silicon layer 130 are patterned resulting in a hard mask region 140' and a fin region 130', respectively, as shown in FIG. 1C. More specifically, the hard mask layer 140 and the silicon layer 130 can be patterned using lithographic and etching processes.

Next, with reference to FIG. 1C, in one embodiment, gate dielectric layers (not shown) are formed on side walls 132' of the fin region 130'. The gate dielectric layers can comprise silicon dioxide. The gate dielectric layers can be formed by thermally oxidizing exposed surfaces of the fin region 130'. It should be noted that, in FIGS. 1C through 1F, the gate dielectric layers are not shown for simplicity.

Figure 1D:
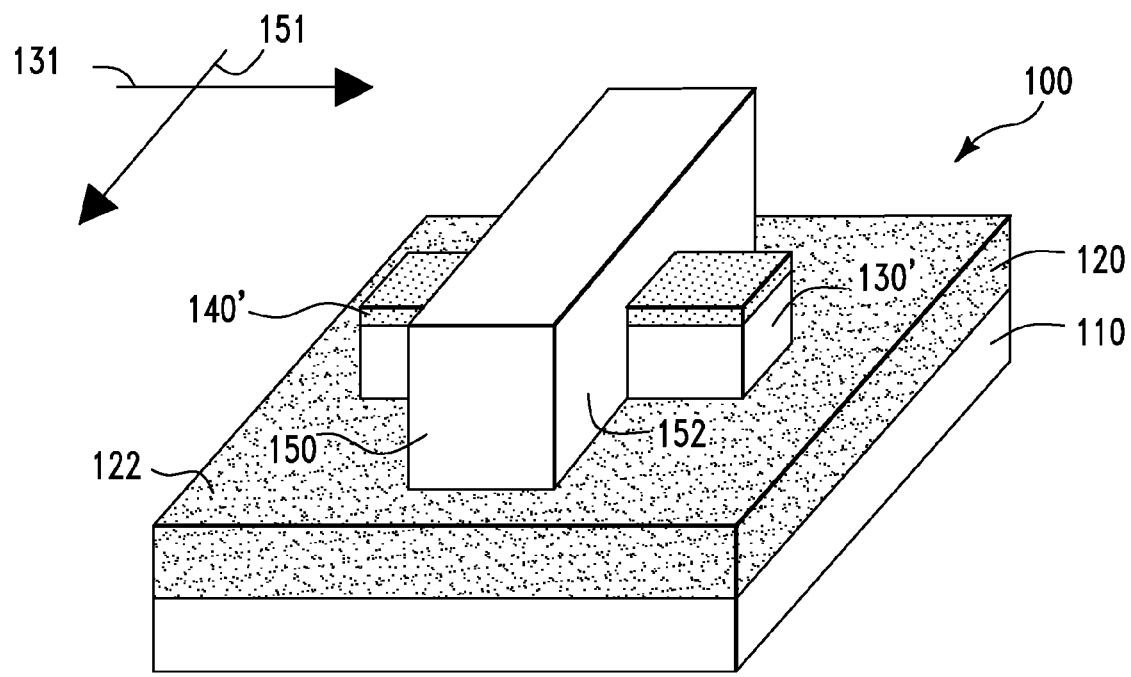

Next, with reference to FIG. 1D, in one embodiment, a gate electrode region 150 is formed on top of the semiconductor structure 100 of FIG. 1C. The gate electrode region 150 can comprise poly-silicon. The gate electrode region 150 can be formed by (i) depositing a poly-silicon layer (not shown) on top of the semiconductor structure 100 of FIG. 1C and (ii) patterning the deposited poly-silicon layer using lithographic and etching processes resulting in the gate electrode region 150 of FIG. 1D. In one embodiment, the fin region 130' runs in a direction 131, whereas the gate electrode region 150 runs in a direction 151, wherein the direction 131 is perpendicular to the direction 151.

Figure 1E:
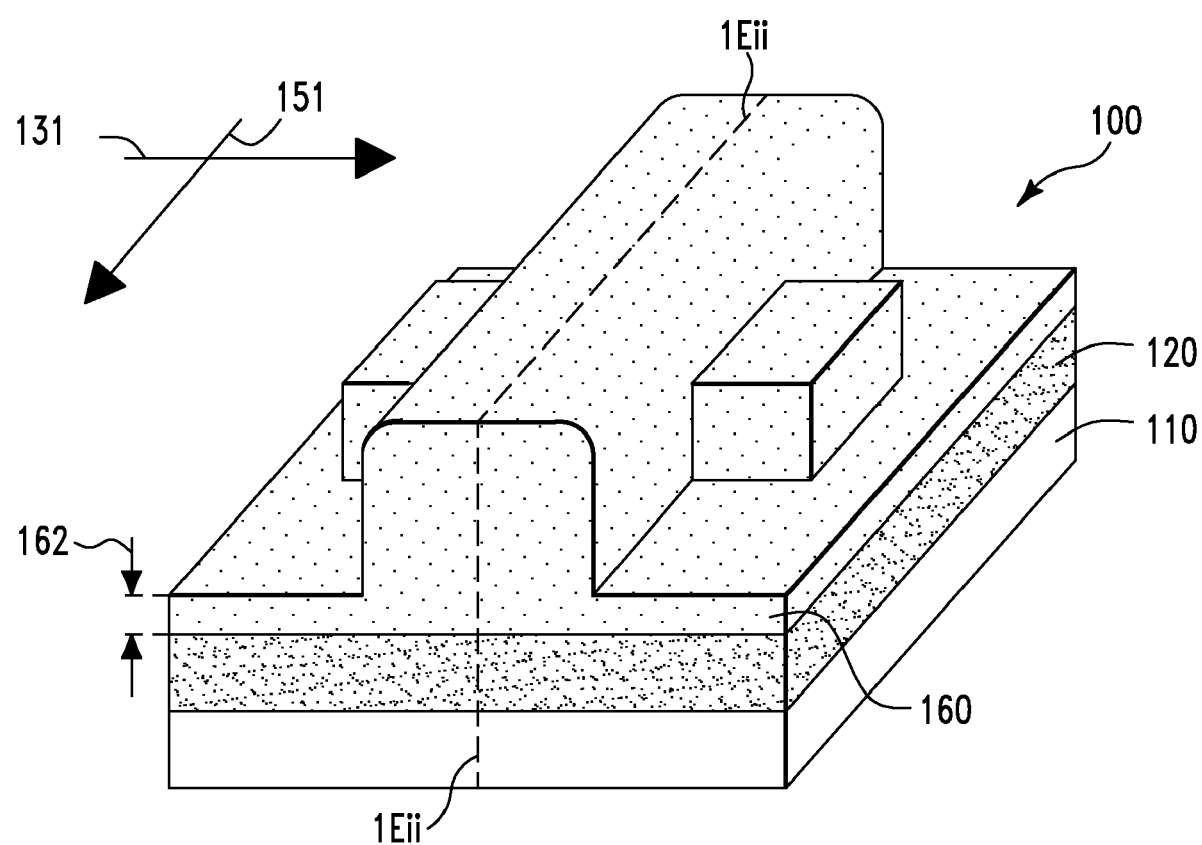

Next, with reference to FIG. 1E, in one embodiment, a spacer layer 160 is formed on top of the semiconductor structure 100 of FIG. 1D. More specifically, the spacer layer 160 can comprise silicon nitride. The spacer layer 160 can be formed by CVD of silicon nitride on top of the semiconductor structure 100 of FIG. 1D. FIG. 1Ei shows a top-down view of the semiconductor structure 100 of FIG. 1E, whereas FIG. 1Eii shows a cross-section view of the semiconductor structure 100 of FIG. 1E along a plane defined by a line 1Eii-1Eii.

Next, with reference to FIGS. 1E, 1Ei, and 1Eii, the spacer layer 160 is bombarded with ions in directions defined by arrows 170a and 170b. The directions 170a and 170b (i) are parallel to the side walls 152 (FIG. 1D) of the gate electrode region 150 and (ii) make an angle of 45° with the top surface 122 of the silicon dioxide layer 120. In one embodiment, the spacer layer 160 is bombarded with argon ions. More specifically, the argon ions are accelerated in an electric field (not shown) such that the ion penetration depth 164 is equal to a thickness 162 of the spacer layer 160 times square root of two. It should be noted that the ion bombardment should not penetrate the gate electrode region 150 and the fin region 130'. As a result, only spacer regions of the spacer layer 160 that are on side walls of the gate electrode region 150 and the fin region 130' that are parallel to the directions 170a and 170b are not damaged (undamaged) by the bombarding ions. These undamaged regions are shown in FIG. 1F as spacer regions 164a, 164b, 162a, and 162b.

Figure 1F:
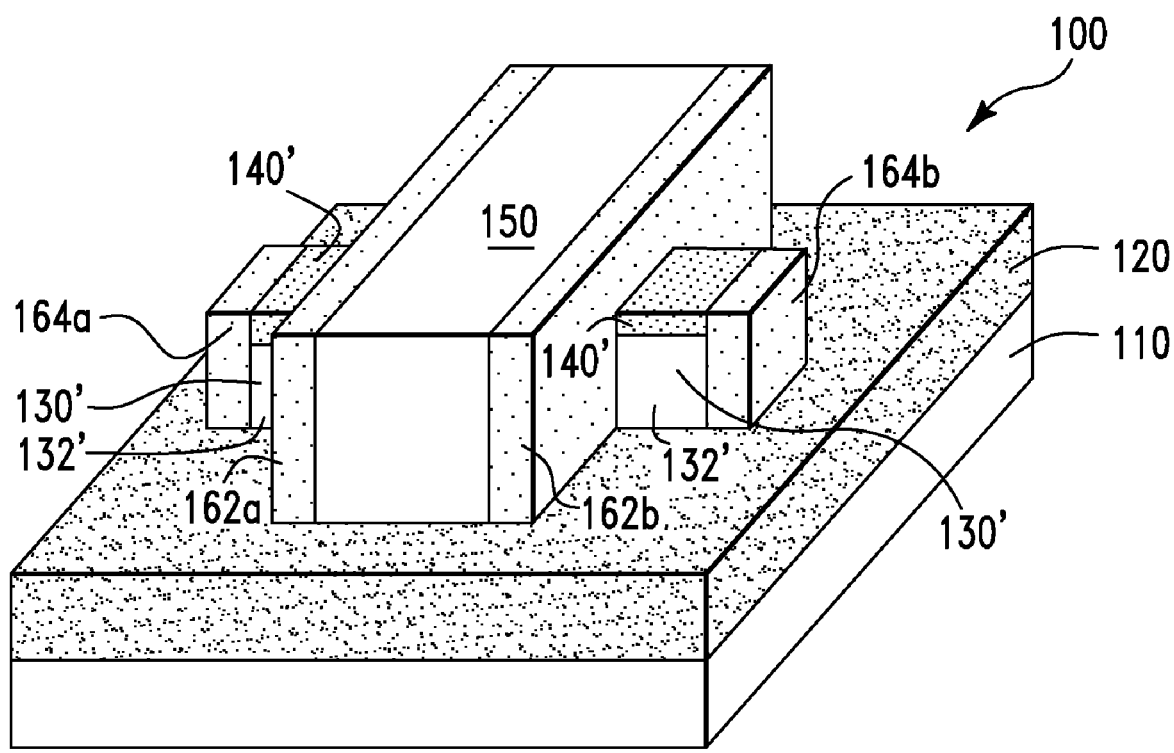

Next, in one embodiment, the damaged spacer regions of the spacer layer 160 are removed resulting in the semiconductor structure 100 of FIG. 1F. The damaged spacer regions can be removed by anisotropic etching. The anisotropic etching is selective to the undamaged spacer regions 164a, 164b, 162a, and 162b of the spacer layer 160 resulting in the undamaged spacer regions 164a, 164b, 162a, and 162b remaining on side walls of the gate electrode region 150 and the fin region 130'. It should be noted that the top surfaces of the undamaged spacer regions 162a and 162b are coplanar with the top surface 156 of the gate electrode region 150. In an alternative embodiment, the damaged spacer regions of the spacer layer 160 are isotropically etched selectively to the undamaged spacer regions 164a, 164b, 162a, and 162b of the spacer layer 160. As a result of inevitable over etching, the removal of the damaged spacer regions also results in the removal of the gate dielectric layers beneath the damaged spacer regions.

Next, in one embodiment, conventional steps can be performed on the semiconductor structure 100 of FIG. 1F to form a transistor (not shown). More specifically, extension and halo regions (not shown) are formed in the fin region 130' using ion implantation. Next, second spacer regions (not shown) are formed on side walls of the spacer regions 162a and 162b, and no spacer is formed on side walls 132' of the fin region 130'. The second spacer regions can be formed in a manner similar to the manner in which the spacer regions 162a and 162b are formed on the side walls 152 (FIG. 1D) of the gate electrode region 150. Next, source/drain regions (not shown) are formed in the fin region 130'. The source/drain regions can be formed by ion implantation in the directions 170a and 170b.

In summary, after the removal the damaged spacer regions of the spacer layer 160, the undamaged spacer regions 162a and 162b of the spacer layer 160 remain on side walls 152 (FIG. 1D) of the gate electrode region 150, whereas the side walls 132' of the fin region 130' are exposed to the surrounding ambient. In other words, the spacer regions 162a and 162b are formed on side walls 152 of the gate electrode region 150, and no spacer is formed on side walls 132' of the fin region 130'. After that, conventional steps can be performed on the semiconductor structure 100 of FIG. 1F to form a transistor.

Figure 2A:
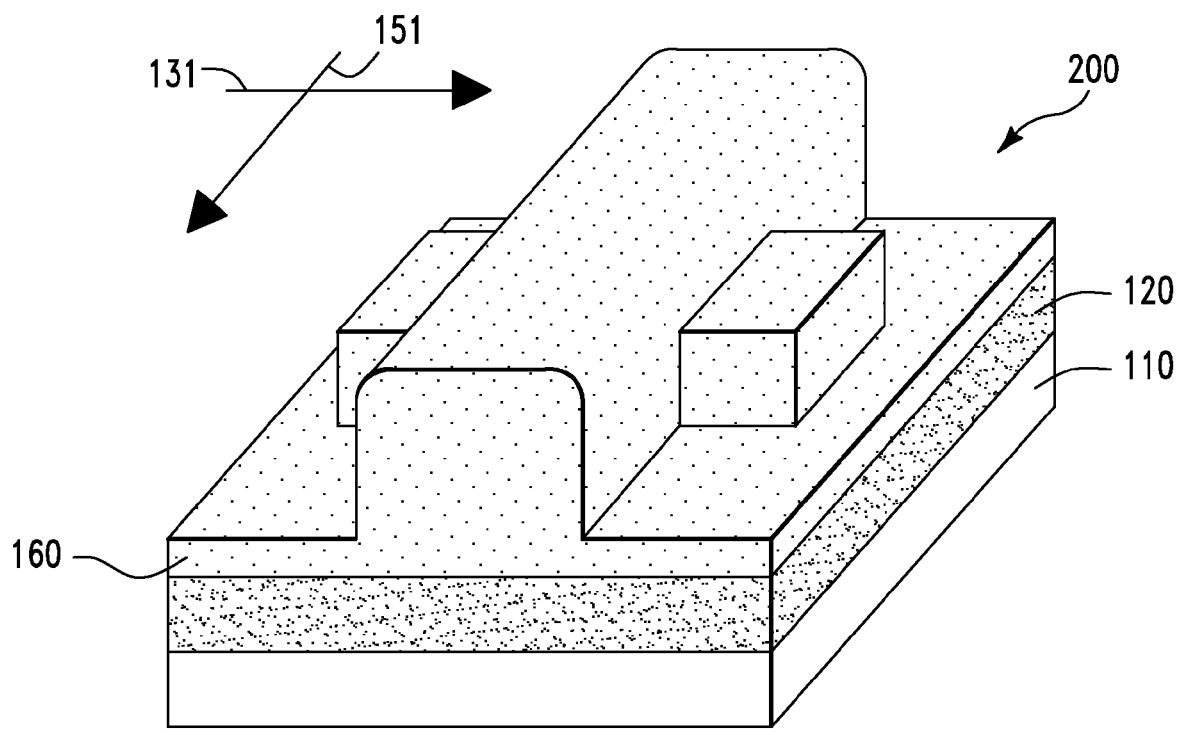
FIGS. 2A-2C show a fabrication process for forming a second semiconductor structure, in accordance with embodiments of the present invention.
Figure 2B:
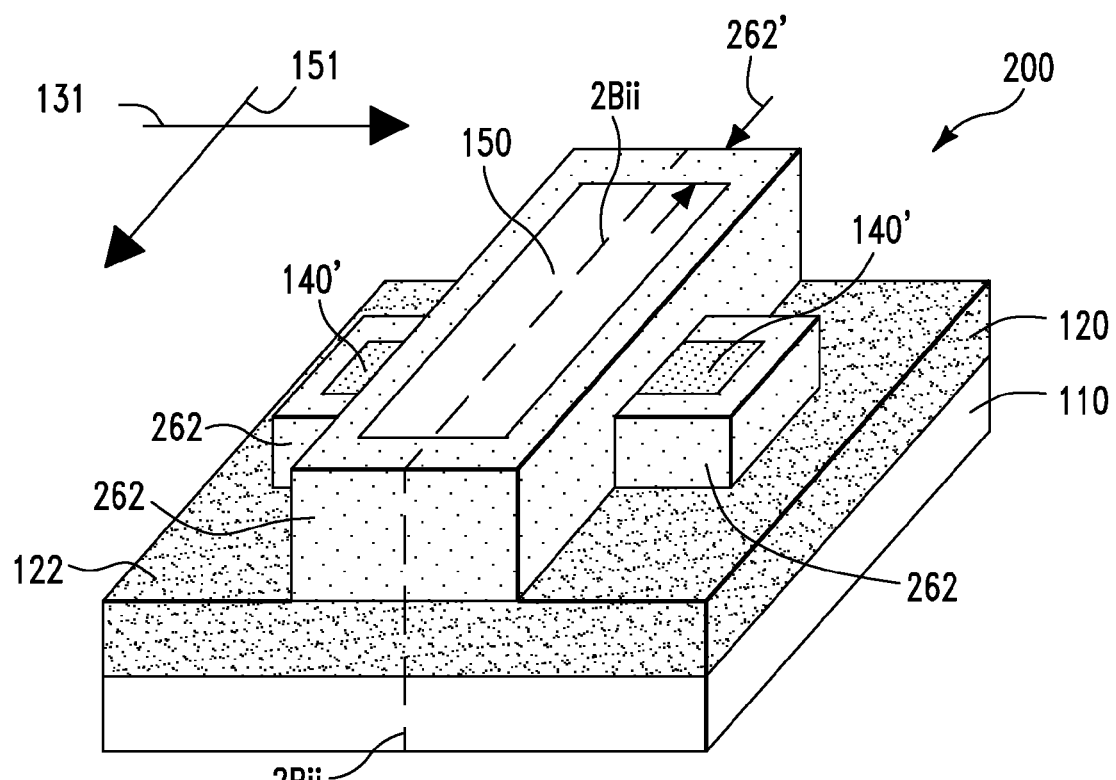
Figure 2C:
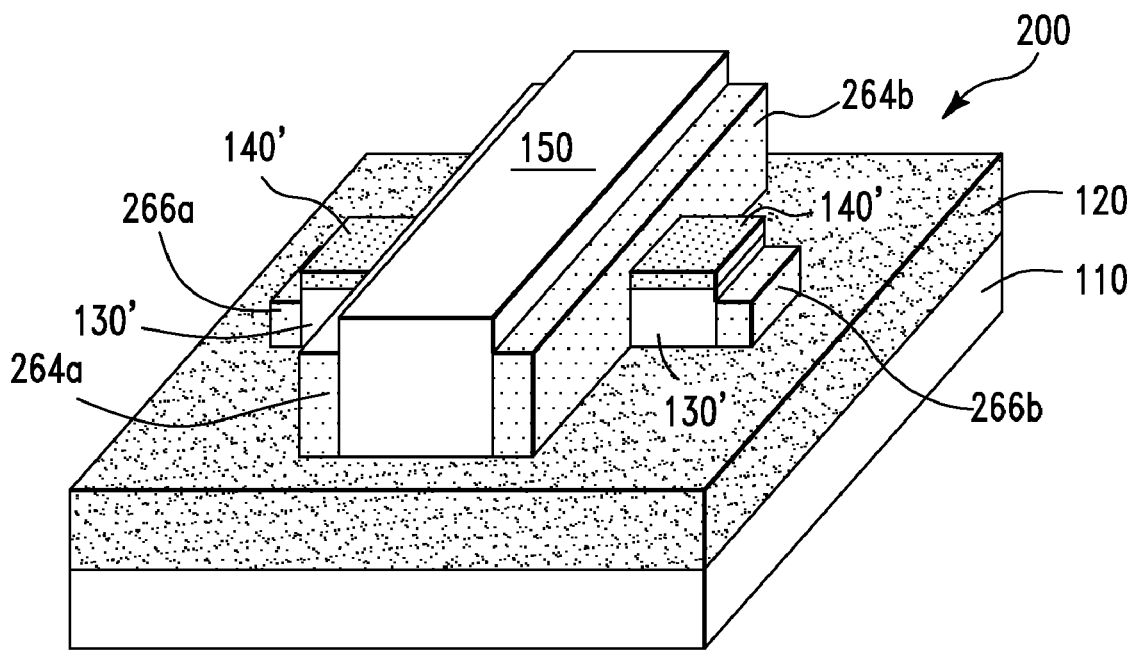

FIGS. 2A-2C show a fabrication process for forming a second semiconductor structure 200, in accordance with embodiments of the present invention. More specifically, the fabrication process for forming the second semiconductor structure 200 starts with the semiconductor structure 200 of FIG. 2A, wherein the semiconductor structure 200 of FIG. 2A is similar to the semiconductor structure 100 of FIG. 1E. The formation of the semiconductor structure 200 of FIG. 2A is similar to the formation of the semiconductor structure 100 of FIG. 1E.

Next, in one embodiment, the spacer layer 160 is anisotropically etched (e.g., using dry etching) resulting in a spacer region 262 on side walls of (i) the gate electrode region 150, (ii) the fin region 130', and (iii) the hard mask region 140' as shown in FIG. 2B. FIG. 2Bi shows a top-down view of the semiconductor structure 200 of FIG. 2B, whereas FIG. 2Bii shows a cross-section view of the semiconductor structure 200 of FIG. 2B along a plane defined by a line 2Bii-2Bii.

Next, with reference to FIGS. 2B, 2Bi, and 2Bii, the spacer region 262 is bombarded with ions in directions defined by arrows 270a and 270b. The directions 270a and 270b (i) are parallel to side walls 152 (FIG. 1D) of the gate electrode region 150 and (ii) make an angle of 45° with the top surface 122 of the silicon dioxide layer 120. In one embodiment, the spacer region 262 is bombarded with argon ions. More specifically, the argon ions are accelerated in an electric field (not shown) such that the ion penetration depth 264' is equal to a thickness 262' of the spacer region 262 times square root of two. It should be noted that the ion bombardment should not penetrate the gate electrode region 150 and the fin region 130'. As a result, only regions of the spacer region 262 that are on side walls of the gate electrode region 150 and the fin region 130' that are parallel to the directions 270a and 270b are not damaged (undamaged) by the bombarding ions. These undamaged spacer regions are shown in FIG. 2C as spacer regions 264a, 264b, 266a, and 266b.

Next, in one embodiment, the damaged regions of the spacer region 262 are removed resulting in the semiconductor structure 200 of FIG. 2C. The damaged spacer regions can be removed by anisotropic (vertical) etching. The anisotropic etching is selective to the undamaged spacer regions of the spacer region 262 resulting in the semiconductor structure 200 of FIG. 2C. As a result of inevitable over etching, the removal of the damaged spacer regions also results in the removal of the gate dielectric layers beneath the damaged spacer regions. Alternatively an isotropic etch can be used to selectively remove the damaged portions of the spacer.

Next, in one embodiment, conventional steps can be performed on the semiconductor structure 200 of FIG. 2C to form a transistor (not shown). More specifically, extension and halo regions (not shown) are formed in the fin region 130' using ion implantation. Next, second spacer regions (not shown) are formed on side walls of the spacer regions 264a and 264b, and no spacer is formed on side walls 132' of the fin region 130'. The second spacer regions can be formed in a manner similar to the manner in which the spacer regions 264a and 264b are formed on the side walls 152 of the gate electrode region 150. Next, source/drain regions (not shown) are formed in the fin region 130'. The source/drain regions can be formed by ion implantation in the directions 270a and 270b.

In summary, after the removal the damaged regions of the spacer region 262, the undamaged spacer regions 264a and 264b of the spacer region 262 remain on side walls 152 (FIG. 1D) of the gate electrode region 150, whereas the side walls 132' of the fin region 130' are exposed to the surrounding ambient. In other words, the spacer regions 264a and 264b are formed on side walls 152 of the gate electrode region 150, and no spacer is formed on side walls 132' of the fin region 130'. After that, conventional steps can be performed on the semiconductor structure 200 of FIG. 2C to form a transistor.

Figure 3A:
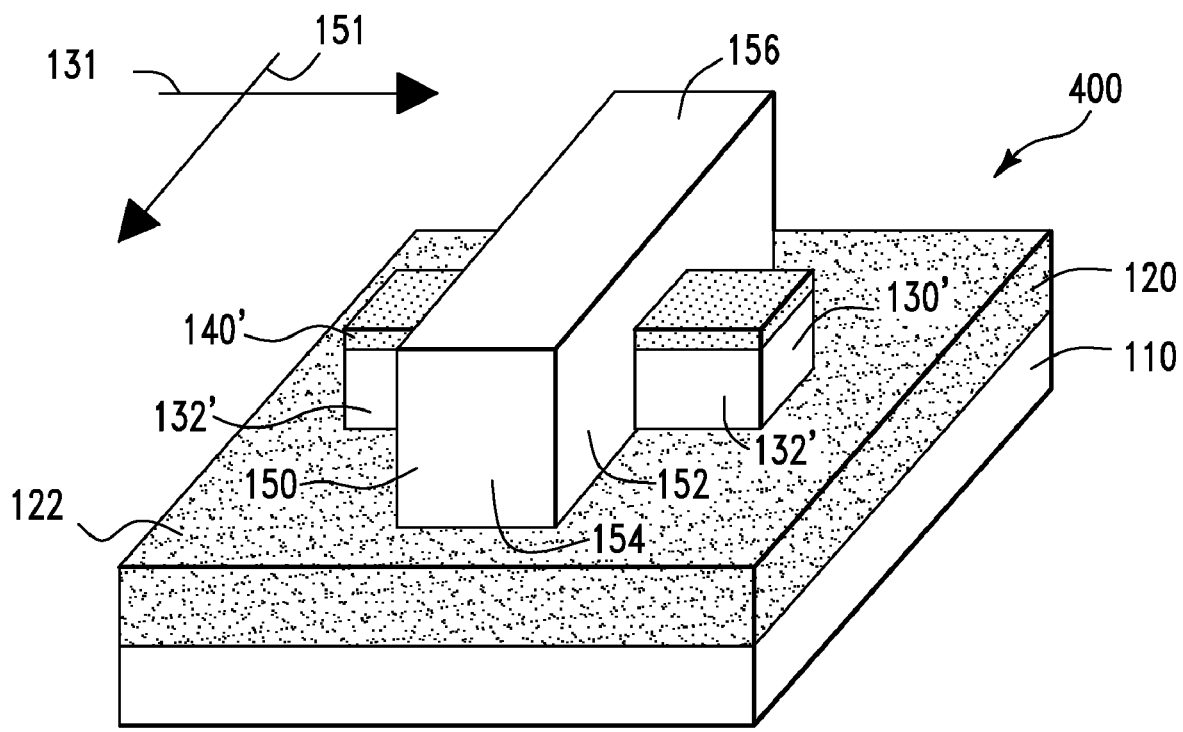
FIGS. 3A-3F show a fabrication process for forming a third semiconductor structure, in accordance with embodiments of the present invention.

FIGS. 3A-3F show a fabrication process for forming a third semiconductor structure 400, in accordance with embodiments of the present invention. More specifically, the fabrication process for forming the third semiconductor structure 400 starts with the semiconductor structure 400 of FIG. 3A, wherein the semiconductor structure 400 of FIG. 3A is similar to the semiconductor structure 100 of FIG. 1D. The formation of the semiconductor structure 400 of FIG. 3A is similar to the formation of the semiconductor structure 100 of FIG. 1D.

Figure 3B:
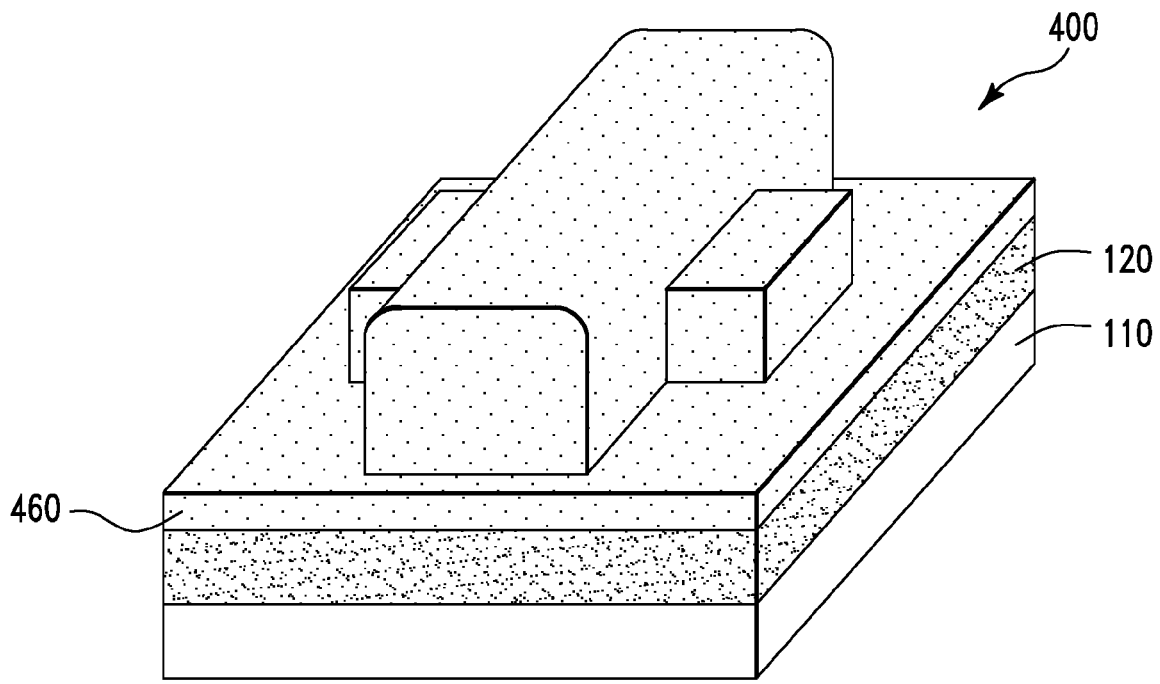

Next, with reference to FIG. 3B, in one embodiment, a first spacer layer 460 is formed on top of the semiconductor structure 400 of FIG. 3A. More specifically, the first spacer layer 460 can comprise silicon nitride. The first spacer layer 460 can be formed by CVD of silicon nitride on top of the semiconductor structure 400 of FIG. 3A.

Figure 3C:
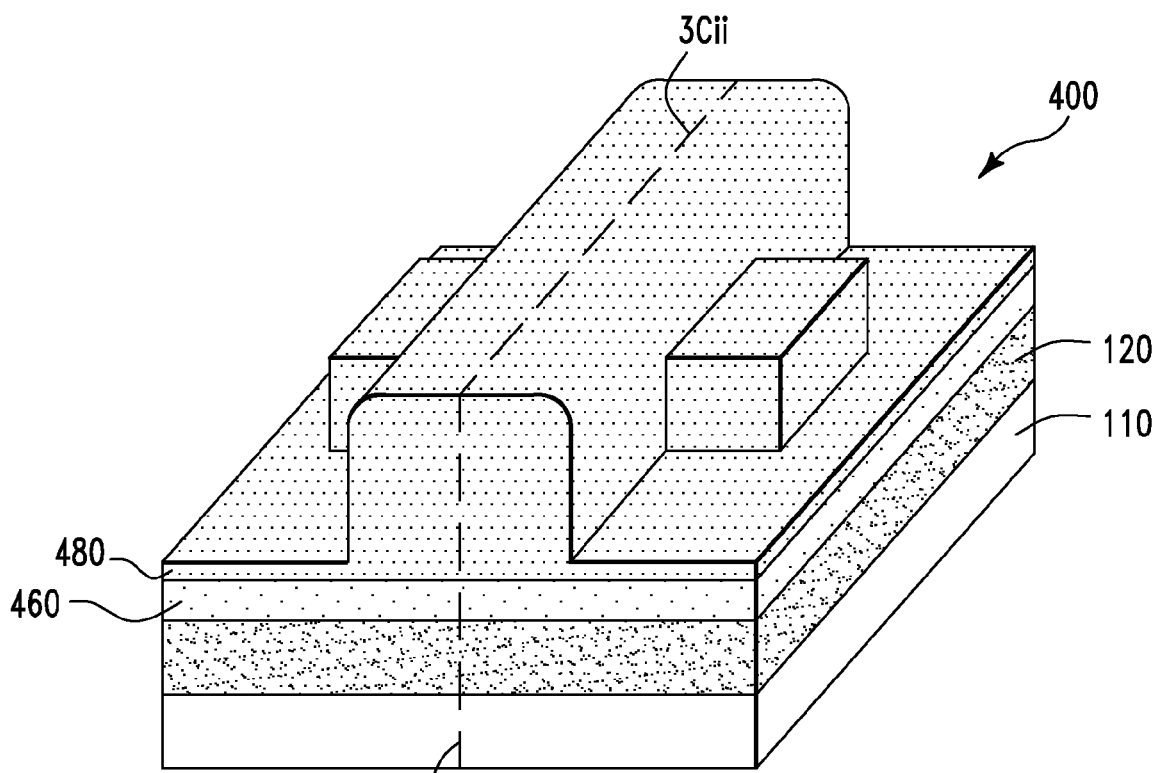

Next, with reference to FIG. 3C, in one embodiment, a second spacer layer 480 is formed on top of the first spacer layer 460 such that the thickness of the first spacer layer 460 is greater than the thickness of the second spacer layer 480. More specifically, the second spacer layer 480 can comprise silicon dioxide. The second spacer layer 480 can be formed by CVD of silicon dioxide on top of the first spacer layer 460. FIG. 3Ci shows a top-down view of the semiconductor structure 400 of FIG. 3C, whereas FIG. 3Cii shows a cross-section view of the semiconductor structure 400 of FIG. 3C along a plane defined by a line 3Cii-3Cii.

Figure 3D:
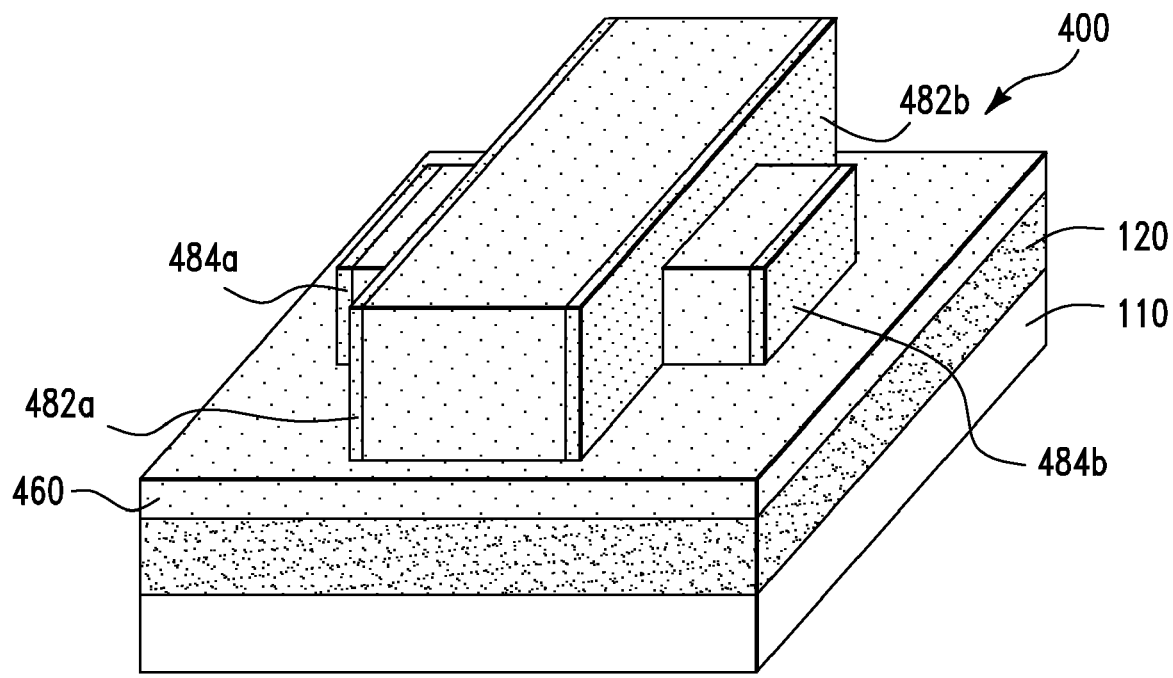

Next, with reference to FIGS. 3C, 3Ci, and 3Cii, the second spacer layer 480 is bombarded with ions in directions defined by arrows 470a and 470b. The directions 470a and 470b (i) are parallel to the side walls 152 of the gate electrode region 150 and (ii) make an angle of 45° with the top surface 122 of the silicon dioxide layer 120. In one embodiment, the second spacer layer 480 is bombarded with argon ions. More specifically, the argon ions are accelerated in an electric field (not shown) such that the ion penetration depth is equal to a thickness of the second spacer layer 480 times square root of two. It should be noted that the ion bombardment should not penetrate the gate electrode region 150 and the fin region 130'. As a result, only regions of the second spacer layer 480 that are on planes that are parallel to the directions 470a and 470b (i.e., on the planes that are parallel to the side walls 152 of the gate electrode region 150) are not damaged (undamaged) by the bombarding ions. These undamaged spacer regions are shown in FIG. 3D as spacer regions 484a, 484b, 482a, and 482b. It can be considered that (i) the spacer regions 482a and 482b are on side walls 152 of the gate electrode region 150 and (ii) the damaged spacer regions of the second spacer layer 480 are on side walls 132' of the fin region 130'.

Next, in one embodiment, the damaged spacer regions of the second spacer layer 480 are removed resulting in the semiconductor structure 400 of FIG. 3D. The damaged spacer regions can be removed by isotropic etching. The isotropic etching is selective to (i) the undamaged spacer regions 484a, 484b, 482a, and 482b of the second spacer layer 480 and (ii) the first spacer layer 460.

Figure 3E:
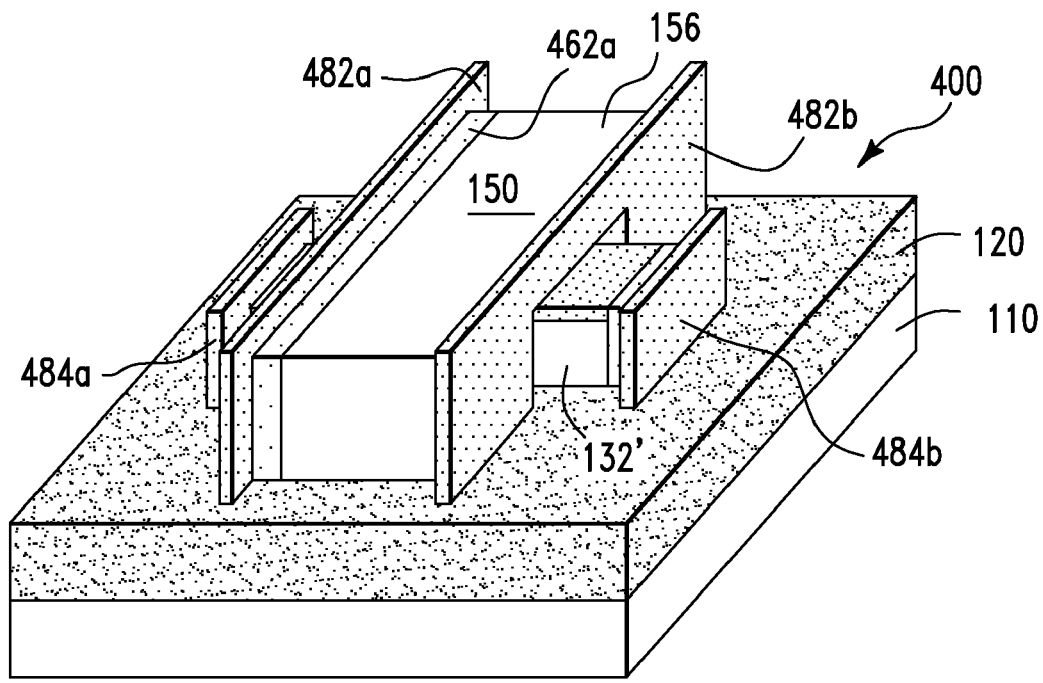

Next, in one embodiment, the first spacer region 460 is isotropically etched until the side walls 132' (FIG. 3E) of the fin region 130' are exposed to the surrounding ambient resulting in the semiconductor structure 400 of FIG. 3E. The isotropic etching is selective to the spacer regions 484a, 484b, 482a, and 482b. As a result, after the isotropic etching of the first spacer region 460, spacer regions 462a and 462b of the first spacer region 460 (shown in FIG. 3F) remain on side walls of the gate electrode region 150, and no spacer remains on side walls 132' of the fin region 130'.

Figure 3F:
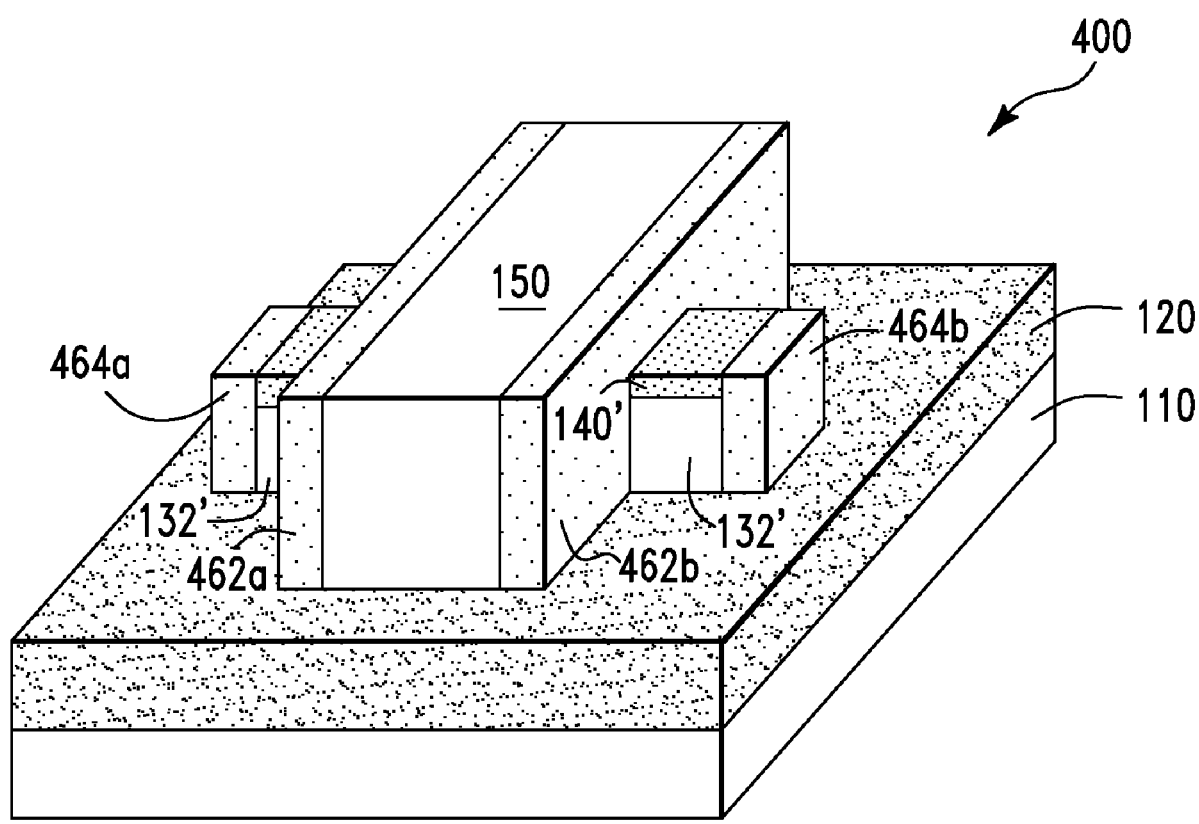

Next, with reference to FIG. 3E, in one embodiment, the spacer regions 484a, 484b, 482a, and 482b are removed resulting in the semiconductor structure 400 of FIG. 3F. The spacer regions 484a, 484b, 482a, and 482b can be removed by isotropic etching. The isotropic etching is selective to spacer regions 462a, 462b, 464a, and 464b (shown in FIG. 3F).

Next, in one embodiment, conventional steps can be performed on the semiconductor structure 400 of FIG. 3F to form a transistor (not shown). More specifically, extension and halo regions (not shown) are formed in the fin region 130' using ion implantation. Next, second spacer regions (not shown) are formed on side walls of the spacer regions 462a and 462b, and no spacer is formed on side walls 132' of the fin region 130'. The second spacer regions can be formed in a manner similar to the manner in which the spacer regions 462a and 462b are formed on the side walls 152 of the gate electrode region 150. Next, source/drain regions (not shown) are formed in the fin region 130'. The source/drain regions can be formed by ion implantation in the directions 470a and 470b.

In summary, after the removal of the spacer regions 484a, 484b, 482a, and 482b, the spacer regions 462a, 462b, 464a, and 464b remain on side walls 152 of the gate electrode region 150, whereas the side walls 132' of the fin region 130' are exposed to the surrounding ambient. In other words, the spacer regions 462a and 462b are formed on side walls of the gate electrode region 150, and no spacer is formed on side walls 132' of the fin region 130'.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
   (a) a substrate;
   (b) a semiconductor fin region on top of the substrate;
   (c) a gate dielectric region on side walls of the semiconductor fin region;
   (d) a gate electrode region on top walls and on said side walls of the semiconductor fin region, wherein the gate dielectric region (i) is sandwiched between and (ii) electrically insulates the gate electrode region and the semiconductor fin region; and
   (e) a spacer layer on top of the substrate, the semiconductor fin region, and the gate electrode region,
       wherein the spacer layer comprises (i) a damaged region on side walls of the semiconductor fin region and (ii) an undamaged region on side walls of the gate electrode region, and
       wherein the damaged region comprises a material which is not present in (i) the undamaged region, (ii) the semiconductor fin region, and (iii) the gate electrode region.

2. The structure of claim 1, wherein the spacer layer comprises silicon nitride.

3. A structure, comprising:
   (a) a substrate which includes a top substrate surface;
   (b) a semiconductor fin region on top of the top substrate surface;
   (c) a gate dielectric region on side walls of the semiconductor fin region;
   (d) a gate electrode region on top walls and on said side walls of the semiconductor fin region, wherein the gate dielectric region (i) is sandwiched between and (ii) electrically insulates the gate electrode region and the semiconductor fin region; and
   (e) a first spacer region on a first side wall of the gate electrode region, wherein a first side wall of the semiconductor fin region is exposed to a surrounding ambient, and wherein a top surface of the first spacer region is coplanar with a top surface of the gate electrode region, and wherein the top surface of the gate electrode region is parallel to the top substrate surface and is exposed to the surrounding ambient.

4. The structure of claim 3, further comprising a second spacer region on a second side wall of the gate electrode region such that the gate electrode region is sandwiched between the first spacer region and the second spacer region,
   wherein a second side wall of the semiconductor fin region is exposed to a surrounding ambient, and
   wherein a top surface of the second spacer region is coplanar with the top surface of the gate electrode region.

5. The structure of claim 3, further comprising a silicon dioxide layer disposed between the substrate and the semiconductor fin region, wherein the semiconductor fin region is in direct mechanical contact with a top surface of the silicon dioxide layer, and wherein the substrate is in direct mechanical contact with a bottom surface of the silicon dioxide layer at the top substrate surface.

6. The structure of claim 3, wherein the semiconductor fin region extends through a total thickness of the gate electrode region.

7. The structure of claim 3, further comprising a hard mask layer on and in direct mechanical contact with a top surface of the semiconductor fin region, and wherein the top surface of the semiconductor fin region is parallel to the top surface of the gate electrode region.

8. The structure of claim 7, further comprising a side spacer region on and in direct mechanical contact with both a side surface of the semiconductor fin region and a side surface of the hard mask layer, and wherein the side surface of the semiconductor fin region and the side surface of the hard mask layer are coplanar.

9. A structure, comprising:
(a) a substrate which includes a top substrate surface;
(b) a semiconductor fin region on top of the top substrate surface;
(c) a gate dielectric region on side walls of the semiconductor fin region;
(d) a gate electrode region on top walls and on said side walls of the semiconductor fin region, wherein the gate dielectric region (i) is sandwiched between and (ii) electrically insulates the gate electrode region and the semiconductor fin region; and
(e) a first spacer region on a first side wall of the gate electrode region. wherein a first side wall of the semiconductor fin region is exposed to a surrounding ambient, and wherein a top surface of the first spacer region is coplanar with a top surface of the gate electrode region; and
(f) a third spacer region on a first side wall of the first spacer region such that the first spacer region is sandwiched between the third spacer region and the gate electrode region.

10. The structure of claim 9, wherein a top surface of the third spacer region is farther away from the top substrate surface than the top surface of the first spacer region.

11. The structure of claim 9,
wherein the first spacer region comprises a first dielectric spacer material,
wherein the third spacer region comprises a second dielectric spacer material, and
wherein the first dielectric spacer material is different from the second dielectric spacer material.

* * * * *